(12) United States Patent  
Moro

(10) Patent No.: US 9,379,730 B2  
(45) Date of Patent: Jun. 28, 2016

(54) IMAGING DEVICE COMPRISING A CIRCUIT FOR ANALOG-DIGITAL CONVERSION BY MEANS OF THE INJECTION OF A QUANTITY OF CHARGES THAT VARIES AS A FUNCTION OF THE NUMBER OF PREVIOUS INJECTIONS

(71) Applicant: COMMISSARIAT A L'ENERGIE ATOMIQUE ET AUX ENERGIES ALTERNATIVES, Paris (FR)

(72) Inventor: Jean-Luc Moro, Le Sappey en Chartreuse (FR)

(73) Assignees: Commissariat A L'Energie Atomique et Aux Energies Alternatives, Paris (FR); Trixell, Moirans (FR)

(*) Notice: Subject to any disclaimer, the term of this patent is extended or adjusted under 35 U.S.C. 154(b) by 85 days.

(21) Appl. No.: 14/360,581

(22) PCT Filed: Nov. 14, 2012

(86) PCT No.: PCT/EP2012/072643  
§ 371 (c)(1),  
(2) Date: May 23, 2014

(87) PCT Pub. No.: WO2013/075993  
PCT Pub. Date: May 30, 2013

(65) Prior Publication Data  
US 2015/0001379 A1    Jan. 1, 2015

(30) Foreign Application Priority Data  
Nov. 24, 2011  (FR) ...................... 11 60739

(51) Int. Cl.  
*H03M 1/34*  (2006.01)  
*H03M 1/18*  (2006.01)  
*G01J 1/02*  (2006.01)  
*G01J 1/18*  (2006.01)  
*H03M 1/60*  (2006.01)

(52) U.S. Cl.  
CPC ................ *H03M 1/34* (2013.01); *G01J 1/0238* (2013.01); *G01J 1/18* (2013.01); *H03M 1/18* (2013.01); *H03M 1/60* (2013.01)

(58) Field of Classification Search  
CPC ........... G01J 1/0238; G01J 1/18; H03M 1/18; H03M 1/34; H03M 1/60  
See application file for complete search history.

(56) References Cited

U.S. PATENT DOCUMENTS

2007/0285300 A1* 12/2007 Peizerat ................ H03M 1/18  
341/157

FOREIGN PATENT DOCUMENTS

EP    0003840 A1    9/1979  
EP    1860778 A1    11/2007

*Primary Examiner* — Francis M Legasse, Jr.  
(74) *Attorney, Agent, or Firm* — Baker & Hostetler LLP

(57) ABSTRACT

In the field of imaging devices comprising a detector generating electric charges in response to incident photon radiation, and an analog-to-digital conversion circuit forming means for reading the quantity of electric charges generated, an analog-to-digital conversion circuit comprises: a comparator which can switch depending on the comparison between a potential on an integration node and a predetermined threshold potential, a counter incrementing with each switch of the comparator, a counter-charge injection circuit injecting a quantity Qc of counter-charges on the integration node with each switch of the comparator, and control means which determine the quantity Qc of counter-charges injected. The analog-to-digital conversion circuit is characterized in that the control means determine the quantity Qc of counter-charges injected as a function of a value of the counter.

8 Claims, 2 Drawing Sheets

US 9,379,730 B2

IMAGING DEVICE COMPRISING A CIRCUIT FOR ANALOG-DIGITAL CONVERSION BY MEANS OF THE INJECTION OF A QUANTITY OF CHARGES THAT VARIES AS A FUNCTION OF THE NUMBER OF PREVIOUS INJECTIONS

CROSS-REFERENCE TO RELATED APPLICATIONS

This application is a National Stage of International patent application PCT/EP2012/072643, filed on Nov. 14, 2012, which claims priority to foreign French patent application No. FR 1160739, filed on Nov. 24, 2011, the disclosures of which are incorporated by reference in their entirety.

FIELD OF THE INVENTION

The invention is situated in the field of imaging devices comprising a detector generating electric charges on receiving a stream of photons, and reading means making it possible to quantify the quantity of electric charges generated. It relates to an analog-to-digital conversion circuit forming such reading means. The imaging devices in question can notably be produced using CMOS technology and be intended for imaging, for example radiological imaging using X or gamma rays or visible or infrared imaging.

BACKGROUND

An imaging device generally comprises a pixel matrix and reading means. Each pixel comprises at least one photosensitive element generating electric charges in proportion to the quantity of photons received. These electric charges, also called photocharges, are processed by the reading means in order to supply information representing the quantity of photons received by each photosensitive element. The reading means can be produced using CMOS technology, which allows them to be incorporated into each pixel. The pixel reading means consist for example of a so-called "charge injection" analog-to-digital conversion circuit that corresponds to the term "charge feedback digital to analog convertor". The term "charge balancing" circuit can also be used.

A charge injection analog-to-digital conversion circuit comprises at least an integration capacitor, a comparator, a counter-charge injection circuit, and a counter. The integration capacitor is linked by one of its electrodes to the photosensitive element of the pixel under consideration. During a phase of exposure of the photosensitive element under consideration, the latter converts the photons into electron-hole pairs. The electric charges, electrons or holes, are collected by an electrode of the detector, then accumulate at the terminals of an integration capacitor, which leads to a variation of the voltage across the terminals of the capacitor. An input of the comparator is linked to the integration capacitor collecting the electric charges. The comparator compares the potential at the level of this input, called detection potential, to a threshold value. Each time the detection potential exceeds the threshold value, the signal at the output of the comparator switches from a first state to a second state. Each switch leads to the incrementation of the counter and the injection of a quantity $Q0$ of counter-charges on the electrode of the integration capacitor in order to compensate for the charges generated by the photosensitive element. If the quantity $Q0$ of counter-charges is correctly calibrated, the detection potential exceeds the threshold value again, and the output signal of the comparator switches from the second state to the first state. The switch of the output signal of the comparator and the injection of the counter-charges are repeated a certain number of times depending on the total quantity of charges generated by the photosensitive element. The number of injections of counter-charges necessary to balance the detection potential thus makes it possible to give a numerical value representing the total quantity of charges generated by the photosensitive element during a given integration time period. A drawback of this charge injection analog-to-digital conversion circuit is that it can only be adapted to a relatively limited range of doses of photons received by the photosensitive element. Indeed, in the aim of allowing the precise quantification of low doses of photons, the quantity $Q0$, which corresponds to the least significant bit of the value encoded by the counter, must be relatively small. However, when the quantity $Q0$ is relatively small, many injections must be performed to be able to quantify a large dose of photons. Thus, the counter must include a large number of bits (16 bits for example) to be able to count all the injections. This is called a "deep" counter. Furthermore, the photon stream is subject to intrinsic noise according to a Poisson law. In other words, the noise of the electric current generated by the photons is proportional to the square root of the number of photons received. Now, the photon stream can vary enormously, for example in a ratio in the order of 1 to $10^4$. As a consequence, if the quantity $Q0$ is calibrated in such a way that it corresponds substantially to the lowest dose that can be received by the photosensitive element, then a large quantity of charges generated by the photosensitive element is encoded with a noise equal to several tens of times the quantity $Q0$. In other words, the quantity of charges is digitized with a precision greatly above the noise, which means that several bits of the counter are used pointlessly.

The patent application EP 1860778 A1 proposes a charge injection analog-to-digital conversion circuit in which the quantity $Qc$ of counter-charges in each injection is modulated as a function of the photon stream, in this case as a function of the electric current generated by this photon stream. The greater the photon stream, the higher the quantity $Qc$. This stream is for example determined by the frequency of the injections. Control means make it possible to modulate the quantity $Qc$ and to control a commutator so as to increment the counter by a number of units depending on this quantity $Qc$. More precisely, the commutator is controlled to increment the counter by a number of units equal to the multiple of the elementary quantity of counter-charges $Q0$. The precision of the digitization is therefore adapted to the detected photon streams. Furthermore, the order of magnitude of this precision is easily determined by the largest quantity $Qc$ of counter-charges injected over a given integration time period. However, the analog-to-digital conversion circuit described in this patent application has the drawback of requiring a commutator at the input of the counter, as well as relatively complex control means. Moreover, in order to allow the digitization of doses of photons over a large range, the counter must always be as deep as that of the conversion circuit described previously.

SUMMARY OF THE INVENTION

An aim of the invention is notably to remedy all or part of the aforementioned drawbacks. The invention notably aims to supply a counter-charge injection analog-to-digital conversion circuit that is of simple design, and in which the counter of the number of injections of counter-charges includes a modest number of bits while making it possible to digitize variable quantities of electric charges with a high degree of precision for the low quantities of electric charges. With this aim, the subject of the invention is an analog-to-digital conversion circuit for an imaging device comprising a detector generating electric charges in response to incident photon radiation, the electric charges leading to a variation of an integration potential on an integration node, the analog-to-digital conversion circuit comprising:

- a comparator which can switch depending on the comparison between the integration potential and a predetermined threshold potential,
- a counter connected to an output of the comparator and incrementing with each switching of the comparator,
- a counter-charge injection circuit injecting a quantity Qc of counter-charges at the integration node with each switch of the comparator, and
- means for controlling the counter-charge injection circuit which determine the quantity Qc of counter-charges injected, the analog-to-digital conversion circuit being characterized in that the control means determine the quantity Qc of counter-charges injected as a function of a value of the counter.

In a particular embodiment, the control means are configured to make the quantity Qc vary each time the value of the counter reaches one or more predetermined threshold values.

The counter can comprise a predetermined number of bits, in which case each predetermined threshold value corresponds for example to the first switch of one of the bits of the counter.

The quantity Qc of counter-charges injected is for example doubled each time the value of the counter reaches a predetermined threshold value.

The counter-charge injection circuit can comprise a plurality of counter-charge injectors which are each able to inject a predetermined quantity of counter-charges.

In a first particular embodiment, the counter-charge injectors are each able to inject one and the same quantity Q0 of counter-charges, the quantity Qc of each injection of counter-charges on the integration node varying by the selection of one or more injectors of counter-charges.

In a second particular embodiment, the counter-charge injectors are each able to inject a different quantity of counter-charges, the quantity Qc of each injection of counter-charges on the integration node varying by the selection of one of the injectors of counter-charges.

Another subject of the invention is an imaging device comprising a detector generating electric charges in response to incident photon radiation, the electric charges leading to a variation of a detection potential on an integration node, and an analog-to-digital conversion circuit as described previously.

The invention notably has the advantage of making it possible to reduce the size of the counter while retaining a precision in the same order of magnitude as the quantity of noise to which the photon stream is subject, whatever the quantity of photons received.

BRIEF DESCRIPTION OF THE DRAWINGS

The invention will be better understood and other advantages will become apparent upon reading the following description, made with reference to the appended drawings in which.

DETAILED DESCRIPTION

Figure 1:
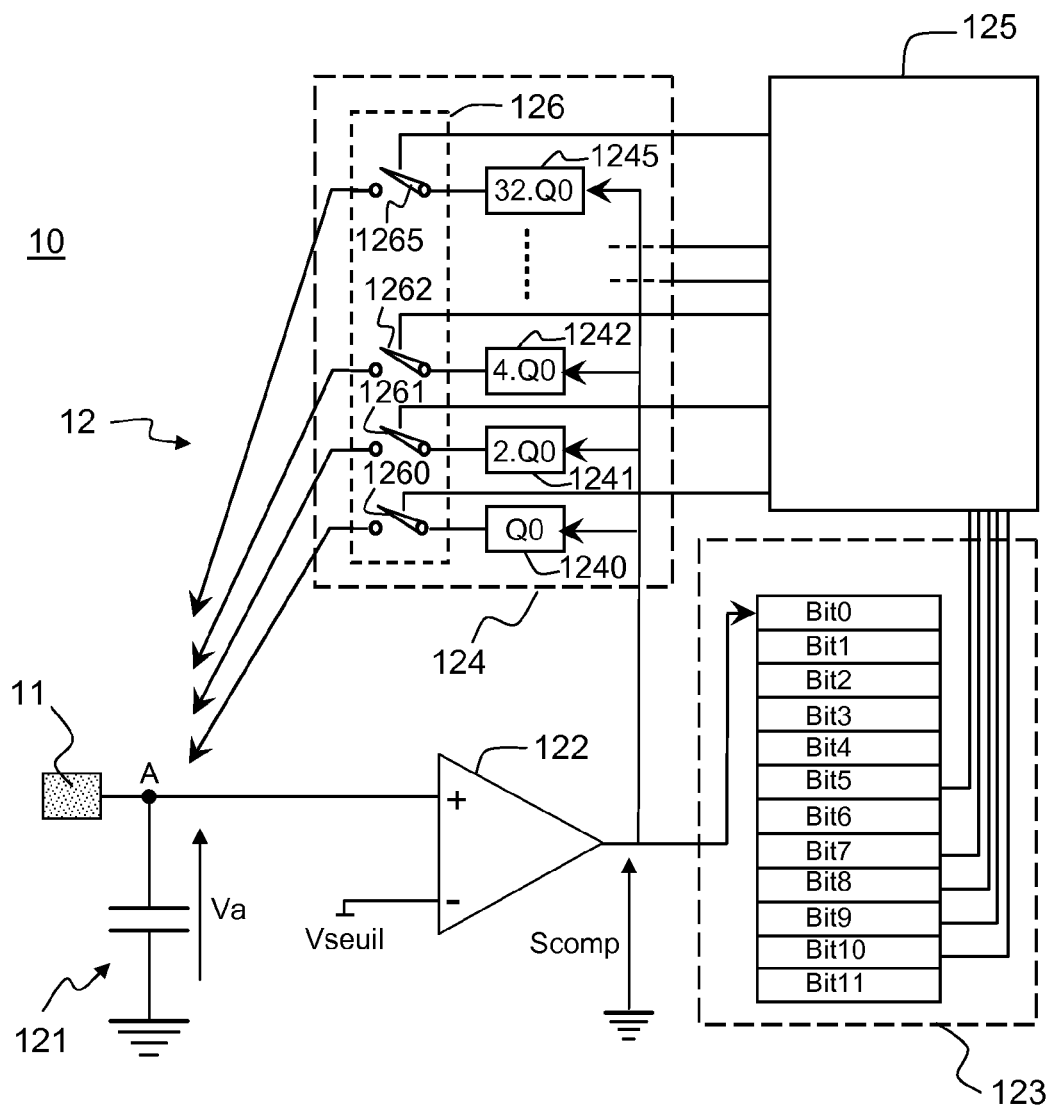
FIG. 1 represents the circuit diagram of a pixel in a first exemplary embodiment of an imaging device according to the invention.

FIG. 1 represents the circuit diagram of a pixel 10 in a first exemplary embodiment of an imaging device according to the invention. The imaging device can include a plurality of pixels organized into a row or into a matrix. Each pixel forms a photosensitive point of the imaging device. The pixel 10 comprises a photosensitive element 11 and an analog-to-digital conversion circuit 12. The photosensitive element 11 forms a detector of the pixel. It is for example formed by a photodiode, by a phototransistor or, more generally, by any device generating electric charges depending, for example proportionally, on the quantity of photons that it receives. The photons under consideration have a wavelength in the visible, infrared, X-ray or gamma ray spectrum, for example. The analog-to-digital conversion circuit 12 is of the so-called "charge injection" type. It comprises an integration capacitor 121, a comparator 122, a counter 123, a counter-charge injection circuit 124 and control means 125. The integration capacitor 121 is linked by one of its electrodes to the photosensitive element 11 and by its other electrode to a reference potential, for example the electric ground of the imaging device. The connecting point between the photosensitive element 11 and the integration capacitor 121 is called integration node A and the potential at this point is called integration potential Va. This node is also connected to a first input of the comparator 122, a second input being connected to a reference potential, called threshold potential Vseuil. The comparator 122 delivers at an output a signal denoted Scomp taking, for example, either a first value, or a second value as a function of the result of the comparison between the integration potential Va and the threshold potential Vseuil. The signal Scomp is for example a voltage. The output of the comparator 122 is connected, on the one hand, to an input of the counter 123 and on the other hand, to an input of the injection circuit 124. The counter 123 for example comprises 12 switches each representing a bit of the counter 123. It can of course include a larger number of switches as a function of the maximum value to be encoded. Moreover, the counter can be produced by any other device able to encode a positive integer value. The counter-charge injection circuit 124 comprises 6 counter-charge injectors 1240 to 1245, and a commutator 126. The commutator 126 is for example formed from six controlled interruptors 1260 to 1265. More generally, the injection circuit 124 can include K counter-charge injectors, denoted 124k, where K is a strictly positive integer, and the commutator can include as many controlled interruptors, denoted 126k, as counter-charge injectors 124k. Each injector 124k is connected to the output of the comparator 122 and can deliver a quantity of $2^k$.Q0 counter-charges. Thus, the injector 1240 can inject a quantity Q0 of counter-charges, the injector 1241 can inject a quantity 2.Q0, and so on. Each controlled interruptor 126k is connected between an output of one of the injectors 124k and the integration node A. The control means 125 make it possible to control the controlled interruptors 126k as a function of the value stored in the counter 123.

In the exemplary embodiment represented in FIG. 1, the analog-to-digital conversion circuit 12 comprises an integration capacitor 121. However, the photosensitive element 11 can optically have a parasitic capacitance sufficient to fulfill the function of the integration capacitor 121. In such a case, the analog-to-digital conversion circuit 12 can dispense with including an integration capacitor.

The analog-to-digital conversion circuit described with reference to FIG. 1 operates in the following manner. On receiving the photons, the photosensitive element 11 generates electric charges, for example electrons, that come to accumulate on the electrode of the integration capacitor 121 connected to the integration node A. This results in a reduction of the integration potential Va. When the potential Va drops below the threshold potential Vseuil, the output signal Scomp switches from a first value, for example '0', to a second value, for example '1'. The signal Scomp is received by the counter 123 and by the injection circuit 124. In particular, the signal Scomp can be received by each counter-charge injector 124k. At each switch from the first to the second value the value of the counter 123 is incremented by one unit, and each counter-charge injector 124k delivers a calibrated quantity of counter-charges. Depending on the state of the commutator 126, the integration node A receives a quantity of counter-charges from one of the injectors 124k. This quantity of counter-charges, denoted Qc, increases the integration potential Va to a value above the threshold potential Vseuil. The output signal Scomp then switches from the second to the first value. The process of digitization described above is repeated a certain number of times as a function of the total quantity of electric charges generated by the photosensitive element 11. The state of the commutator 126, and therefore the quantity Qc of counter-charges of each injection, depends on the value of the counter 123. Before receiving photons, the value of the counter 123 is set to zero. The commutator 126 is then controlled to close the controlled interruptor 1260, the other controlled interruptors 1261-1265 being open. Thus, each switch of the output signal Scomp triggers the incrementation of the value of the counter 123 by one unit and the injection of a quantity Qc of counter-charges equal to Q0. The quantity Qc remains equal to Q0 until the value of the counter 123 reaches a first predetermined threshold value. This first threshold value corresponds for example to the first switch of the sixth bit (Bit5 in FIG. 1) of the counter 123, i.e. to the value 32. When the value of the counter reaches the first threshold value, the control means 125 control the commutator 126 so as to close the controlled interruptor 1261, the other controlled interruptors 1260 and 1262-1265 being opened.

Thus, each switch of the output signal Scomp still triggers the incrementation of the value of the counter 123 by one unit, but the injection of a quantity Qc of counter-charges equal to 2.Q0. The quantity Qc remains equal to 2.Q0 until the value of the counter 123 reaches a second predetermined threshold value. This second threshold value corresponds for example to the first switch of the eighth bit (Bit7 in FIG. 1) of the counter 123, i.e. to the value 128.

When the value of the counter reaches the second threshold value, the control means 125 control the commutator 126 so as to close the controlled interruptor 1262, the other controlled interruptors 1260, 1261 and 1263-1265 being open. Thus, each switch of the output signal Scomp triggers the incrementation of the value of the counter 123 by one unit, and the injection of a quantity Qc of counter-charges equal to 4.Q0. Analogously, the quantity Qc increases in steps when the value of the counter 123 reaches the threshold values 256, 512 and 1024, i.e. when the ninth, tenth and eleventh bits, respectively, switch for the first time.

It should be noted that the quantity Qc in fact corresponds to the digitization step (or quantification step) of the total quantity Qt of counter-charges injected at the integration node A, this total quantity Qt being, for example, proportional to the dose of photons received by the photosensitive element 11 from the time it starts to receive photons. The precision of the digitization therefore evolves in steps with the value of the counter 123.

In the measure that the value of the counter 123 is always incremented by one unit, whatever the quantity Qc of counter-charges injected, the relationship between the value of the counter 123 and the total quantity Qt is not linear.

However, this relationship is fixed for a given set of threshold values to which the quantity Qc adds. These threshold values correspond to the values of the counter 123 triggering a modification of the quantity Qc of counter-charges injected.

The total quantity Qt can therefore be directly determined from the value of the counter 123. In particular, a correspondence table can be used to determine the total quantity Qt from the value of the counter 123. The following table presents an extract from such a correspondence table for a pixel of an exemplary imaging device sensitive to X rays. A first column indicates the value of the counter 123. A second column indicates the corresponding quantity Qc for each injection from this value. A third column indicates the total quantity Qt of counter-charges injected on the integration node A until the last switch of the signal Scomp. Finally, a fourth column indicates the quantity of noise to which the stream of photons X is subject.

| Counter | Qc | Qt | Noise X |
|---|---|---|---|
| 1 | 1 | 1 | |
| 2 | 1 | 2 | |
| 3 | 1 | 3 | |
| 4 | 1 | 4 | |
| 13 | 1 | 13 | 1 |
| 15 | 1 | 15 | |
| 16 | 1 | 16 | |
| 25 | 1 | 25 | |
| 31 | 1 | 31 | |
| 32 | 2 | 33 | |
| 46 | 2 | 61 | 2.7 |
| 63 | 2 | 95 | |
| 64 | 2 | 97 | |
| 65 | 2 | 99 | |
| 127 | 2 | 223 | |
| 128 | 4 | 227 | |
| 129 | 4 | 231 | |
| 255 | 4 | 735 | |
| 256 | 8 | 743 | |
| 315 | 8 | 1215 | 12 |
| 511 | 8 | 2783 | |
| 512 | 16 | 2799 | |
| 513 | 16 | 2815 | |
| 1023 | 16 | 10975 | |
| 1024 | 32 | 11007 | |
| 1060 | 32 | 12159 | 38 |
| 1250 | 32 | 18239 | 46 |
| 2047 | 32 | 43743 | 72 |

This table notably shows that the quantity of noise is indeed in the same order of magnitude as the digitization step (Qc) of the total quantity Qt. Moreover, it shows that the total quantity Qt that can be determined by the analog-to-digital conversion circuit according to the invention with a counter on 12 bits is equal to 43743, i.e. a value greatly above the value that can be stored in a counter on 12 bits, namely 2047. For an analog-to-digital conversion circuit of the prior art, a total quantity Qt equal to 43743 requires a counter on 16 bits. The invention indeed makes it possible to reduce the size of the counter, and therefore the number of digital data to be transferred as well as the number of connections between the counter 123 and other elements of the imaging device. The reduction of the number of connections can be used either to reduce the size of the pixels of the imaging device or to increase the surface area of each photosensitive element. The use of a device according to the invention makes it possible to preserve a high dynamic range of measurement while reducing the electrical activity of the circuit, and therefore the power consumption.

Figure 2:
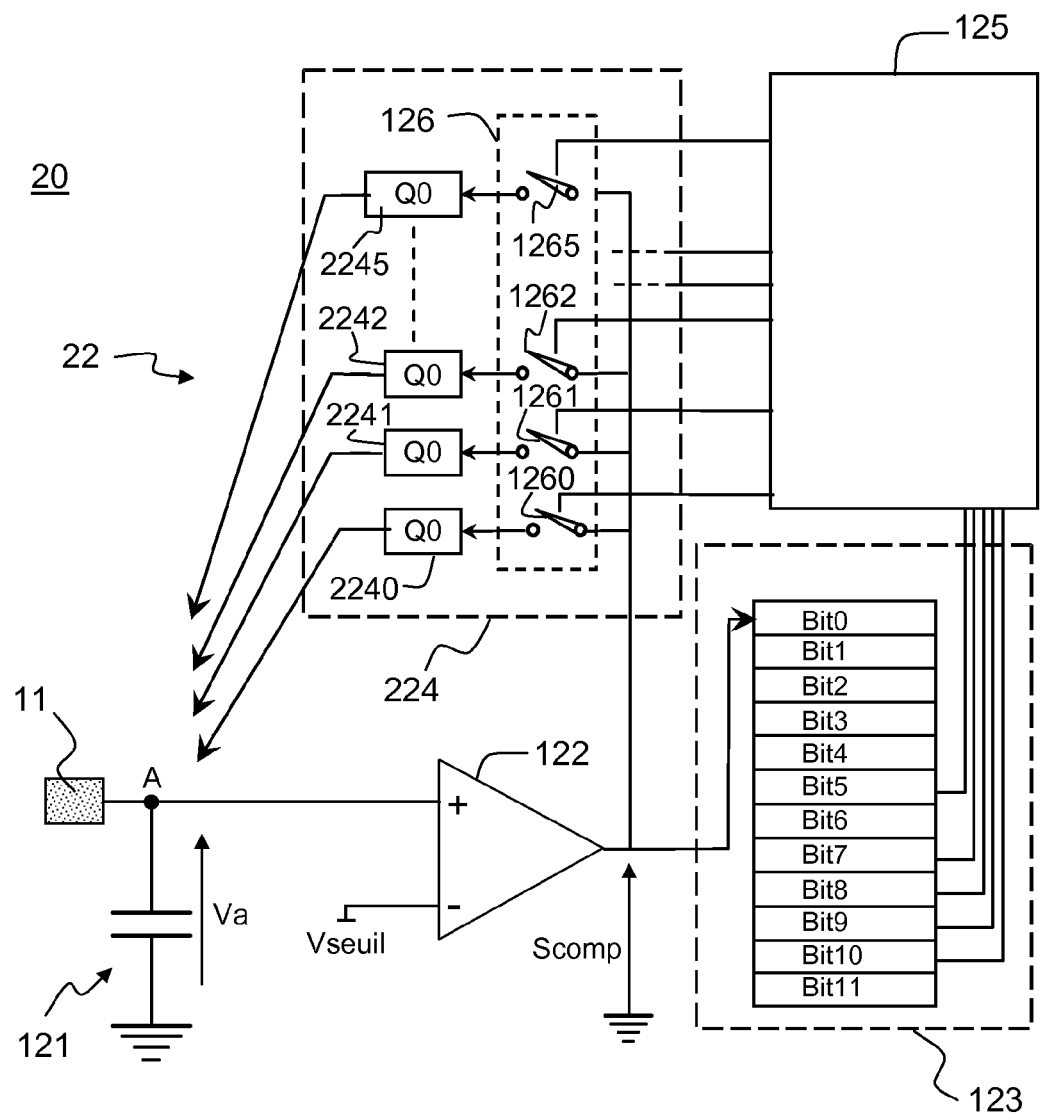
FIG. 2 represents the circuit diagram of a pixel in a second exemplary embodiment of an imaging device according to the invention.

FIG. 2 represents the circuit diagram of a pixel 20 in a second exemplary embodiment of an imaging device according to the invention. The pixel 20 differs from the pixel 10 represented in FIG. 1 by the counter-charge injection circuit. In the injection circuit 224 of the pixel 20, all the injectors 224k are able to deliver one and the same quantity Q0 of electric counter-charges. Furthermore, each controlled interruptor 126k of the commutator 126 is connected between the output of the comparator 122 and one of the injectors 224k. The controlled interruptors 126k are still controlled by the control means 125 as a function of the value of the counter 123. In this exemplary embodiment, an injector 224k only delivers counter-charges if the controlled interruptor 126k to which it is connected is controlled in the on state. Moreover, in order to increase the quantity Qc of counter-charges injected at the integration node A, the control means 125 progressively control a larger number of controlled interruptors 126k in the on state. In a particular embodiment, the number of controlled interruptors 126k controlled in the on state increases in a progression of powers of 2. The quantity Qc is then doubled each time the value of the counter reaches one of the threshold values.

In the embodiments described with reference to FIGS. 1 and 2, the quantity Qc of counter-charges of each injection increases when certain bits of the counter 123 switch for the first time. However, the counter can be produced by other means than switches and the quantity Qc can increase to any threshold values. Similarly, it is considered that the quantity Qc is doubled each time the value of the counter reaches one of the threshold values. However, the quantity Qc can evolve differently. It can notably be determined so as to substantially follow the quantity of noise associated with the total quantity Qt of counter-charges injected.

The invention claimed is:

1. An analog-to-digital conversion circuit for an imaging device comprising a detector generating electric charges in response to incident photon radiation, the electric charges leading to a variation of an integration potential on an integration node, the analog-to-digital conversion circuit comprising:
a comparator which configured to switch when the integration potential exceeds a predetermined threshold potential;
a counter connected to an output of the comparator and configured to increment with each switch of the comparator;
a counter-charge injection circuit configured to inject a quantity Qc of counter-charges at the integration node with each switch of the comparator; and
means for controlling the counter-charge injection circuit which determine the quantity Qc of counter-charges injected,
wherein the control means are configured to determine the quantity Qc of counter-charges injected as a function of a value of the counter being incremented at each switch of the comparator.

2. The circuit as claimed in claim 1, wherein the control means are configured to make the quantity Qc vary each time the value of the counter reaches one or more predetermined threshold values.

3. The circuit as claimed in claim 2, wherein the counter comprises a predetermined number of bits, each predetermined threshold value corresponding to the first switch of one of the bits of the counter.

4. The circuit as claimed in claim 2, wherein the quantity Qc of counter-charges injected is doubled each time the value of the counter reaches a predetermined threshold value.

5. The circuit as claimed in claim 1, wherein the counter-charge injection circuit comprises a plurality of counter-charge injectors which are each configured to inject a predetermined quantity of counter-charges.

6. The circuit as claimed in claim 5, wherein the counter-charge injectors are each configured to inject one and the same quantity Qc of counter-charges, the quantity Qc of each injection of counter-charges at the integration node varying by the selection of one or more injectors of counter-charges.

7. The circuit as claimed in claim 5, wherein the counter-charge injectors are each configured to inject a different quantity of counter-charges, the quantity Qc of each injection of counter-charges at the integration node varying by the selection of one of the injectors of counter-charges.

8. An imaging device comprising a detector generating electric charges in response to incident photon radiation, the electric charges leading to a variation of a detection potential on an integration node, and an analog-to-digital conversion circuit as claimed in claim 1.

* * * * *